United States Patent
Ganapathisubramanian et al.

(10) Patent No.: US 8,237,133 B2
(45) Date of Patent: Aug. 7, 2012

(54) ENERGY SOURCES FOR CURING IN AN IMPRINT LITHOGRAPHY SYSTEM

(75) Inventors: Mahadevan Ganapathisubramanian, Austin, TX (US); Byung-Jin Choi, Austin, TX (US); Liang Wang, Austin, TX (US); Alex Ruiz, Spicewood, TX (US)

(73) Assignee: Molecular Imprints, Inc., Austin, TX (US)

( * ) Notice: Subject to any disclaimer, the term of this patent is extended or adjusted under 35 U.S.C. 154(b) by 273 days.

(21) Appl. No.: 12/511,593

(22) Filed: Jul. 29, 2009

(65) Prior Publication Data

US 2010/0090130 A1 Apr. 15, 2010

Related U.S. Application Data

(60) Provisional application No. 61/104,331, filed on Oct. 10, 2008.

(51) Int. Cl.
*G21K 5/00* (2006.01)

(52) U.S. Cl. ............. 250/492.21; 250/492.1; 250/492.2; 250/453.11; 250/455.11; 250/504 R

(58) Field of Classification Search ............ 250/453.11–455.11, 492.1, 492.2, 492.22, 493.1, 504 R; 264/405, 446, 447
See application file for complete search history.

(56) References Cited

U.S. PATENT DOCUMENTS

| | | | |
|---|---|---|---|
| 5,897,195 A * | 4/1999 | Choate | 362/33 |
| 6,112,588 A | 9/2000 | Cavallaro et al. | |
| 6,204,895 B1 | 3/2001 | Nakamura et al. | |
| 6,580,505 B1 | 6/2003 | Bareket | |
| 6,683,421 B1 * | 1/2004 | Kennedy et al. | 315/291 |
| 6,986,975 B2 | 1/2006 | Sreenivasan et al. | |
| 7,119,886 B2 | 10/2006 | Leenders et al. | |
| 7,292,326 B2 | 11/2007 | Nimmakayala et al. | |
| 7,470,921 B2 * | 12/2008 | Custer | 250/504 R |
| 7,630,067 B2 | 12/2009 | Nimmakayala et al. | |
| 7,841,741 B2 * | 11/2010 | Chan et al. | 362/249.04 |
| 2002/0093122 A1 | 7/2002 | Choi et al. | |
| 2003/0112421 A1 * | 6/2003 | Smith | 355/71 |
| 2004/0257571 A1 * | 12/2004 | Mieher et al. | 356/401 |
| 2006/0032437 A1 | 2/2006 | McMackin et al. | |
| 2006/0233501 A1 * | 10/2006 | Sampson | 385/115 |
| 2007/0104813 A1 * | 5/2007 | Wuister et al. | 425/174.4 |
| 2007/0141191 A1 | 6/2007 | Kruijt-Stegeman | |

(Continued)

FOREIGN PATENT DOCUMENTS

WO  WO 2006/114369  11/2006

(Continued)

OTHER PUBLICATIONS

White et al., Novel Alignment System for Imprint Lithography, J. Vac. Sci. Technol. B 18(6), pp. 3552-3556 Nov. 1, 2000.
PCT/US2009/004454 International Search Report, Apr. 8, 2010, EPO pp. 1-11.

*Primary Examiner* — Michael Maskell
(74) *Attorney, Agent, or Firm* — Cameron A. King

(57) ABSTRACT

Energy sources and methods for curing in an imprint lithography system are described. The energy sources may include one or more energy elements positioned outside of the viewing range of an imaging unit monitoring elements of the imprint lithography system. Each energy source is configured to provide energy along a path to solidify polymerizable material on a substrate.

18 Claims, 8 Drawing Sheets

U.S. PATENT DOCUMENTS

2007/0231421 A1* 10/2007 Nimmakayala et al. ... 425/174.4
2008/0280227 A1* 11/2008 Sievers ...................... 430/270.1
2010/0038827 A1* 2/2010 Nimmakayala et al. ...... 264/447
2011/0048621 A1* 3/2011 Pekurovsky et al. ......... 156/191

FOREIGN PATENT DOCUMENTS

WO    WO 2006114369 A2 * 11/2006
WO    WO 2007/123249 A2    11/2007
WO    WO 2007123249 A2 * 11/2007

* cited by examiner

ENERGY SOURCES FOR CURING IN AN IMPRINT LITHOGRAPHY SYSTEM

CROSS-REFERENCE TO RELATED APPLICATIONS

This application claims the benefit under 35 U.S.C. §119(e)(1) of U.S. Provisional No. 61/104,331 filed on Oct. 10, 2008, which is hereby incorporated by reference herein.

BACKGROUND INFORMATION

Nano-fabrication includes the fabrication of very small structures that have features on the order of 100 nanometers or smaller. One application in which nano-fabrication has had a sizable impact is in the processing of integrated circuits. The semiconductor processing industry continues to strive for larger production yields, while increasing the circuits per unit area formed on a substrate; therefore, nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. Additionally, the substrate may be coupled to a substrate chuck. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
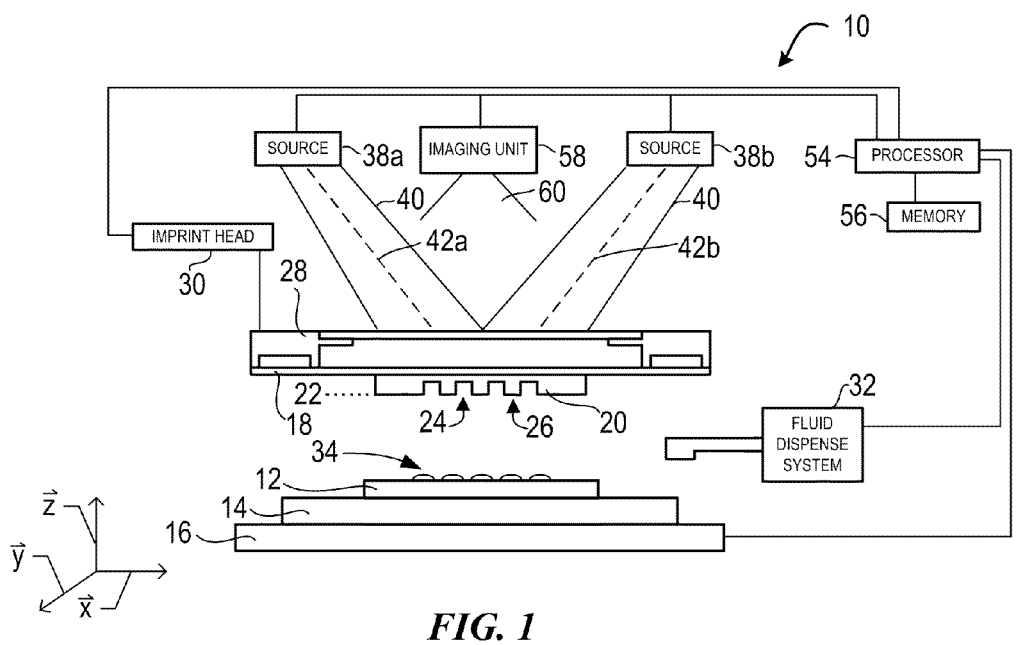
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference.

Figure 2:
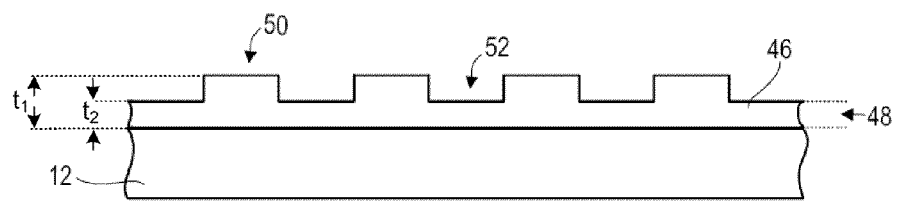
FIG. 2 illustrates a simplified side view of the substrate illustrated in FIG. 1, having a patterned layer thereon.

Referring to FIGS. 1 and 2, system 10 may further comprise one or more sources 38a and 38b (generally referred to herein as source 38) coupled to direct energy 40 along one or more path 42 respectively (generally referred to as path 42). For example, system 10 illustrated in FIG. 1 comprises source 38 coupled to direct energy 40 along path 42 respectively. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

System 10 further may comprise an imaging unit 58. Imaging unit 58 may be used for optical detection and/or monitoring of template 18, polymerizable material 34, patterned layer 46, and/or substrate 12. Generally, imaging unit 58 has a viewing range 60 that may be increased or decreased depending on design considerations. Exemplary imaging units 58 are further described in U.S. Ser. No. 10/923,628, U.S. Ser. No. 11/000,321, U.S. Ser. No. 11/000,331, and U.S. Ser. No. 11/347,198.

As shown, imaging unit 58 may be coupled to processor 54, however, imaging unit 58 may also be coupled to any element of system 10, including, but not limited to template 18, imprint head 30, chuck 14, stage 16, and source 38. Further, system 10 may comprise any number of imaging units 58. Exemplary imaging units 58 are further described in U.S. Ser. No. 10/923,628, U.S. Ser. No. 11/000,321, U.S. Ser. No. 11/000,331, U.S. Ser. No. 11/347,198, and U.S. Ser. No. 11/565,350, which are all hereby incorporated by reference in their entirety. Imaging unit 58 may be positioned in superimposition with the template 18, substrate 12, chuck 14, stage 16, and/or the like.

Either imprint head 30, stage 16, or both may vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 may produce energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. For example, source 38 illustrated in FIG. 1 may produce energy along path 42 causing polymerizable material 34 to solidify and/or cross-link to define patterned layer 46. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

In some circumstances, high power radiation may be provided to solidify and/or cross-link polymerizable material 34 to conform to the shape of substrate 12 and template 18 contacting polymerizable material 34. For example, ultraviolet radiation may be provided by Hg lamps, Hg/Xe lamps, UV LEDs, and/or lasers. Such high power radiation, however, may induce a large thermal influence into the imprinting fields (e.g. individually imprinted sub-portions of substrate). The thermal influence may result in alignment error and/or magnitude error on substrate 12.

In order to minimize error from thermal influence, sources 38 may be located a distance away from substrate 12 and/or imprinting field. Optical power, however, may be significantly reduced if in order to reach substrate 12 and/or imprinting field, energy 40 provided by sources 38 travels through multiple air gaps, lens, mirrors, and such, to reach the imprinting area. Additionally, sources 38 having high power radiation may require regular replacement of the light source that may further increase expense of the imprinting process. Also, depending on selection of source 38, source 38 providing energy 40 may produce a significant amount of heat during use. Such energy 40 may cause the temperature of substrate 12 to increase if source 38 is placed in close proximity to substrate 12. With an increase in temperature, substrate 12 may expand affecting the accuracy of features 50 and 52.

Figure 3:
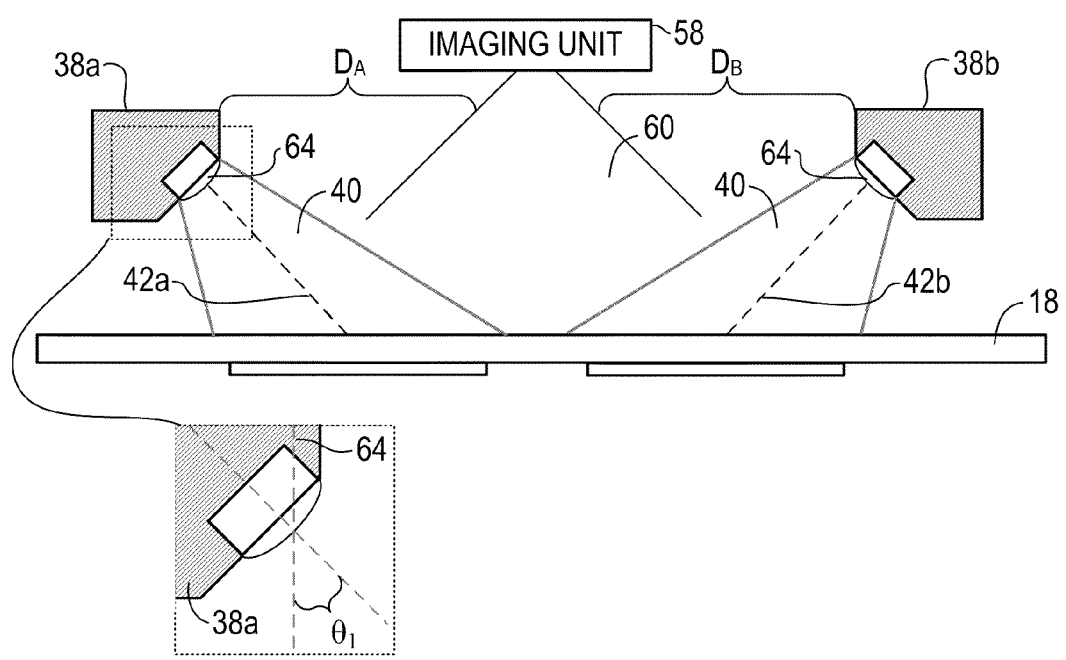
FIG. 3 illustrates a simplified side view of an exemplary embodiment of multiple energy sources providing energy to a template.

Referring to FIGS. 3 and 4, the imprint process, as described in relation to FIGS. 1 and 2, may handle variations of intensity of energy 40 from source(s) 38. As such, source 38 may be a cumulative energy source having multiple elements 64 providing energy 40. Alternatively, source 38 may be a single energy source having a single element 64 providing energy 40

Referring to FIGS. 3 and 4, illustrated therein are exemplary embodiments of source 38 having a single energy element 64 providing energy 40 along path 42. Generally, placement of source 38 and/or element 64 may be such that viewing range 60 of imaging unit 58 is not obstructed. For example, as illustrated in FIG. 3, source 38a may be positioned a distance $D_A$ from the viewing range 60 of imaging unit 58. In a similar fashion, source 38b may be positioned a distance $D_B$ from the viewing range 60 of imaging unit 58. Distance $D_A$ and distance $D_B$ may be determined such that source 38 and/or element 64 are outside of viewing range 60 of imaging unit 58. It should be noted that path 42 of energy may be within viewing range 60 of imaging unit 58 without obstructing viewing range 60 of imaging unit 58.

Figure 4A:
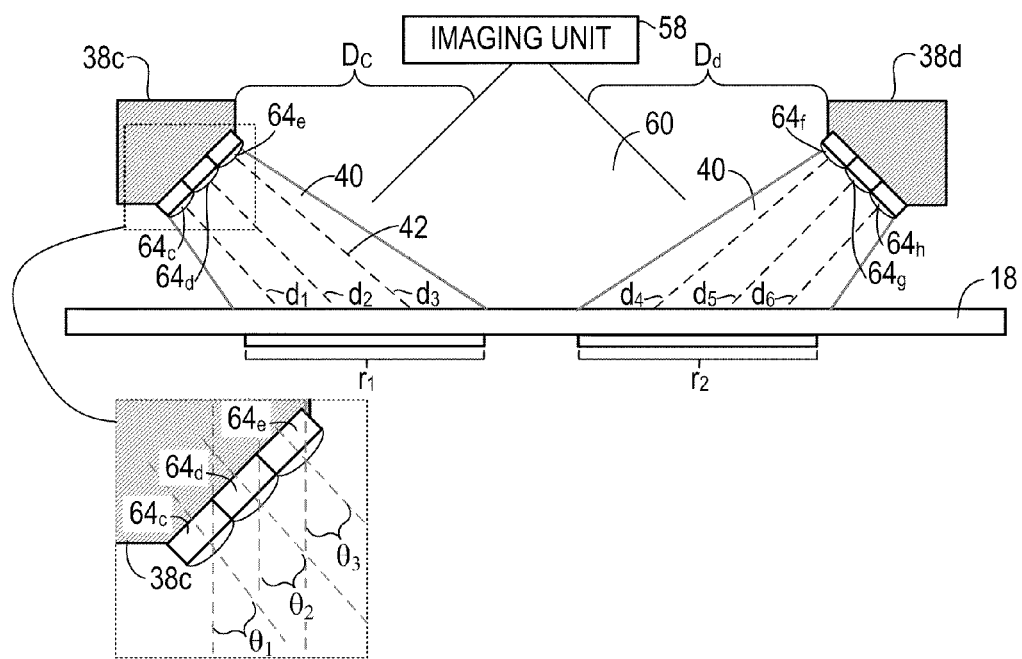
FIGS. 4A and 4B illustrate a simplified side view of an exemplary embodiment of multiple energy sources providing energy to a template.

Each element 64 may be positioned at a distance d from a region r of substrate 12. Distance d may be selected to provide substantially uniform distribution of energy 40 on region r of substrate 12. For example, as illustrated in FIG. 4A, each element 64c, 64d, and 64e of energy source 38c may be positioned at a distance $d_1$, $d_2$, and $d_3$ from region $r_1$ of substrate 12. Distances $d_1$, $d_2$, and $d_3$ may be selected to provide substantially uniform distribution of energy 40 across region $r_1$ of substrate 12. For example, distances $d_1$, $d_2$, and $d_3$ may be on the order of approximately 55-110 mm in an exemplary embodiment.

It should be noted that source 38 may be used in conjunction with a supplementary energy source. For example, source 38 may be used in conjunction a supplementary energy source such as Hg lamps, Hg/Xe lamps and/or lasers. Supplementary energy source may be positioned within the viewing range 60 of imaging unit 58 and/or positioned at a distance from the viewing range of imaging unit 58 such that viewing range 60 of imaging unit 58 is not obstructed.

Figure 4B:
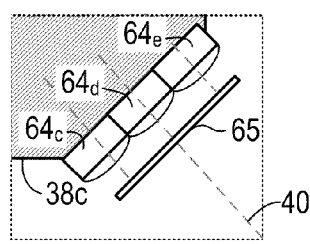

Source 38 may comprise single or multiple energy elements 64 (e.g., UV LEDs). For example, FIG. 3 illustrates sources 38a and 38b having single energy elements 64a and 64b. Alternatively, FIGS. 4A and 4B illustrate source 38c and 38d having multiple energy elements 64c-h. It should be noted that any number of energy elements 64 may be used depending on design considerations. For example, source 38 may comprise a large quantity of LEDs each having a low unit power (e.g., approximately 3-20 mW/cm² to provide an intensity of approximately 200 mW/cm² in one cm² embodiment).

Within source 38, energy element 64 may be inclined at an angle ⊖. In one embodiment, energy elements 64 within source 38 may be inclined at substantially similar angles. For example, FIG. 3 illustrates source 38a having energy element 64a inclined at angle $⊖_1$ to provide energy 40 via path 42a. It should be noted, however, that energy elements 64 within source 38 may be inclined at different angles. For example, FIG. 4A illustrates source 38c having energy elements 64c-64e inclined at angles $⊖_{1-3}$ respectively. The magnitude of inclined angles $⊖_{1-3}$ may be of different values. For example, the magnitude of inclined angles $⊖_{1-3}$ may be different values within the range of approximately 35°-50°. Inclining energy elements 64 may provide sufficient energy 40 to the imprinting area without obstructing viewing range 60. Additionally, inclining energy elements 64 may adequately combine beams of energy 40 to provide substantially uniform energy within/on a region r of substrate 12 (as illustrated in FIG. 3).

FIG. 4B illustrates another exemplary embodiment of source 38c of FIG. 4A with the additional of an optical element 65. Optical element 65 may direct energy 40 from energy elements 64. Additionally, optical element 65 may contain the beam path 42 to provide substantially uniform distribution of energy 40. Optical element 65 may include, but is not limited to, lens, optical waveguide(s), and/or the like. It should be noted that individual optical elements 65 may be provided for each energy source 38 and/or a single optical element 65 may be provided for multiple energy sources 38.

Source 38 may additionally comprise a heat management system (not shown). For example, source 38 may include a heat exhaust system attached to and/or in thermal communication with source 38.

Figure 5A:
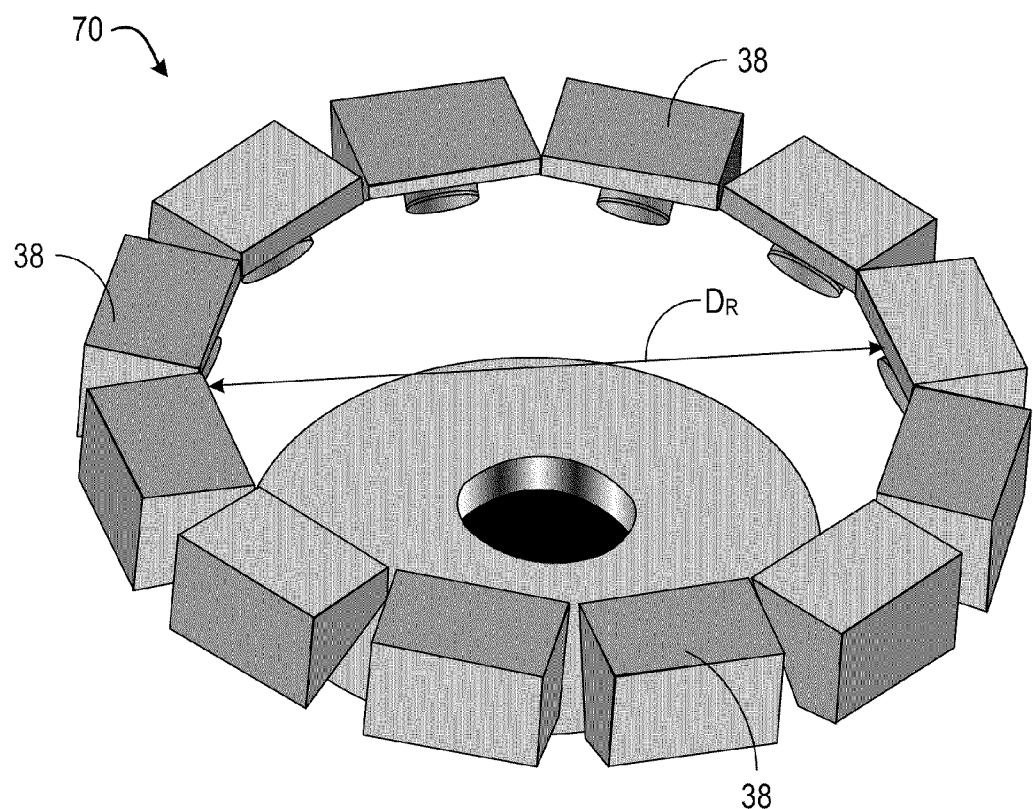
FIG. 5A illustrates a top down view of an exemplary embodiment of multiple energy sources in ring formation.
Figure 5B:
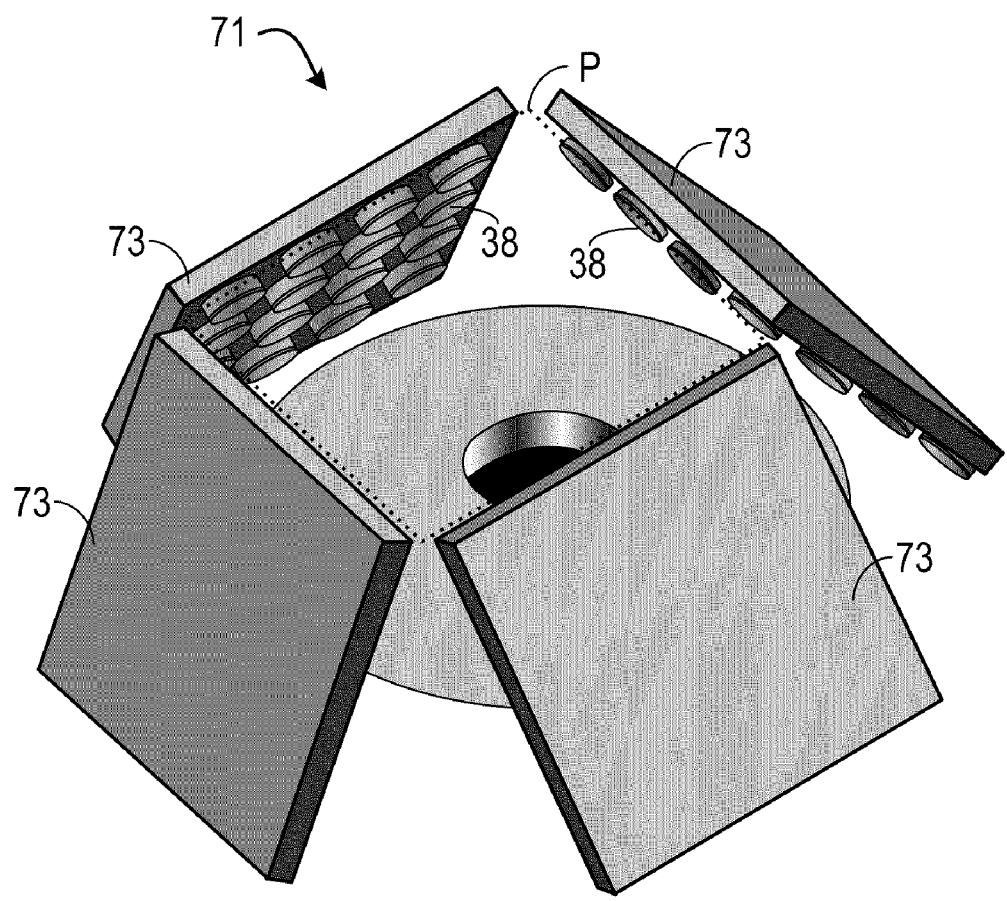
FIG. 5B illustrates a top down view of an exemplary embodiment of multiple energy sources in pyramid formation.

FIGS. 5A-5B illustrate exemplary embodiments of multiple sources 38 in different formations. It should be noted that multiple sources 38 are not solely confined to the illustrated formations, as other configurations may be used depending on design considerations.

FIG. 5A illustrates an exemplary embodiment of multiple sources 38 in a ring formation 70. Ring formation 70 may be defined by an inner diameter $D_R$. Generally, inner diameter $D_R$ of ring formation 70 is of such a magnitude and configuration that viewing range 60 of imaging unit 58 (not shown) is not obstructed.

FIG. 5B illustrates an exemplary embodiment of multiple sources 38 in a pyramid formation 71. Pyramid formation 71 may be defined by multiple sides 73 forming an inner perimeter P. Generally, inner perimeter P of pyramid formation 71 is such a magnitude and configuration that viewing range 60 of imaging unit 58 (not shown) is not obstructed.

Figure 5C:
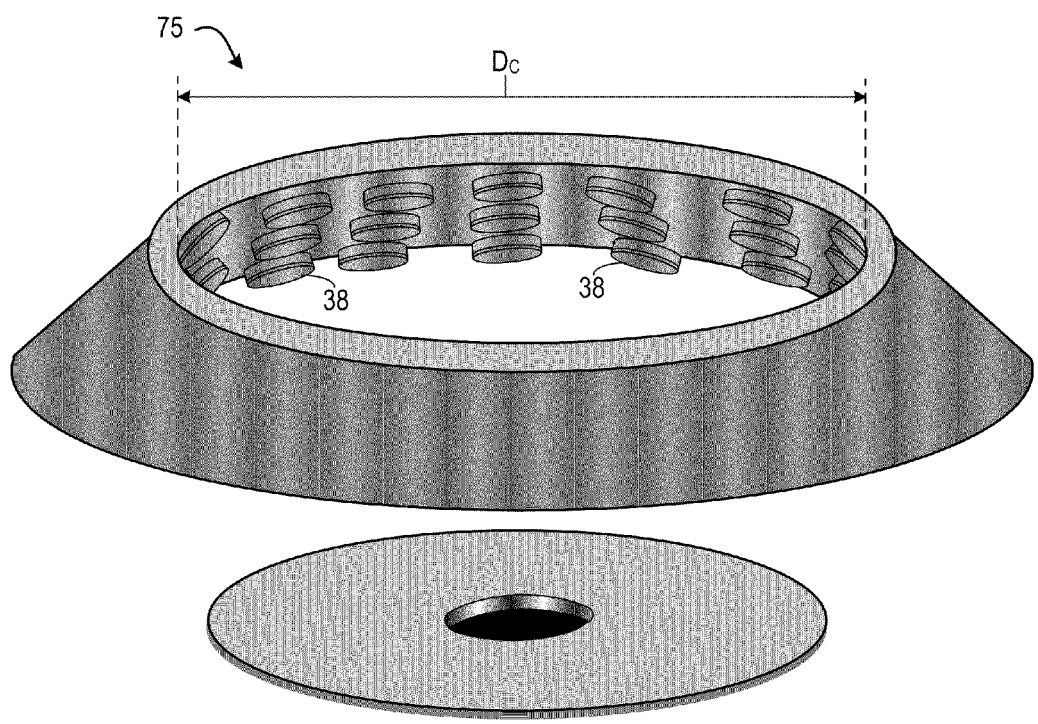
FIG. 5C illustrates a top down view of an exemplary embodiment of multiple energy sources in cone formation.

FIG. 5C illustrates an exemplary embodiment of multiple sources 38 in a cone formation 75. The cone formation 75 may be defined by an inner diameter $D_C$. Generally, inner diameter $D_C$ of cone formation 75 is such a magnitude and configuration that viewing range 60 of imaging unit 58 (not shown) is not obstructed.

Figure 6:
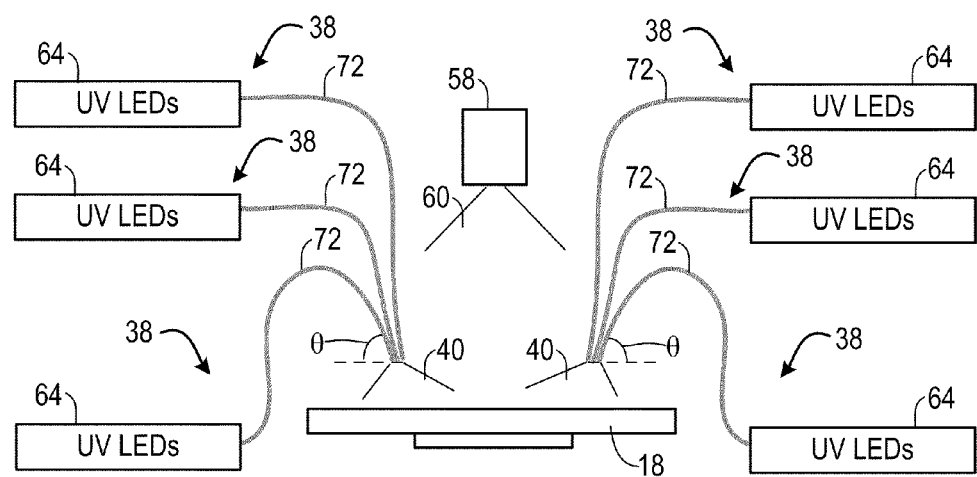
FIG. 6 illustrates a simplified side view of an exemplary embodiment of multiple energy sources providing energy to a template.

FIG. 6 illustrates another exemplary embodiment of system 10 having multiple sources 38. Each source 38 generally comprises at least one energy element 64 in optical communication with optical line 72 to provide energy 40 to imprinting area. As such, optical line 72 may allow energy element 64 to be remotely located from imprinting area. Exemplary optical lines 72 may include, but are not limited to fiber bundles, waveguides, and/or the like. Optical line 72 may be made of materials including, but not limited to fused silica based fibers, liquid light guides, and/or the like.

Placement of energy element 64 remotely from imprinting area may be based on design considerations. For example, energy element 64 may be coupled to optical line 72 with placement of energy element 64 at a distance providing adequate energy 40 for imprinting. In one embodiment, energy element 64 may be positioned more than approximately 2 m from imprinting area.

Generally, optical line 72 directs energy 40 from energy element 64 to the imprinting area without substantially blocking the viewing range 60 of imaging unit 58. For example, as illustrated in FIG. 6, optical line 72 may be inclined at an angle ⊖ to direct energy 40 from energy element 64 via path 42 to the imprinting area. Inclining optical line 72 may provide sufficient energy 40 to the imprinting area without obstructing viewing range 60.

Figure 7:
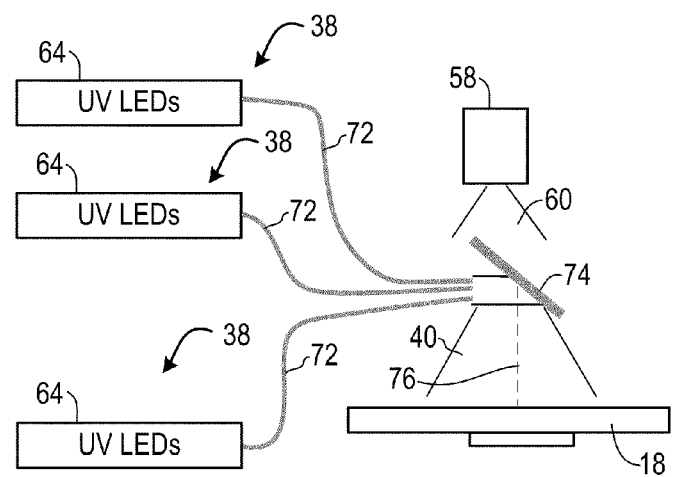
FIG. 7 illustrates a simplified side view of an exemplary embodiment of multiple energy sources providing energy to a template.

FIG. 7 illustrates another exemplary embodiment of system 10 having multiple sources 38. Sources 38 may comprise at least one energy element 64 in optical communication with optical line 72. For example, energy element 64 may be coupled to optical line 72. System 10 may additionally comprise a reflective element 74 (e.g., mirror) focusing energy 40 from sources 38 to the imprint area. Energy 40 may be directed along path 42 from optical lines 72 to reflective element 74, and further to imprinting area (e.g., field on substrate 12). Generally, the material of reflective element 74 is substantially translucent. Translucent material may allow reflective element 74 to direct energy 40 from optical line 72 to the imprinting area without substantially blocking the viewing range 60 of imaging unit 58.

Figure 8:
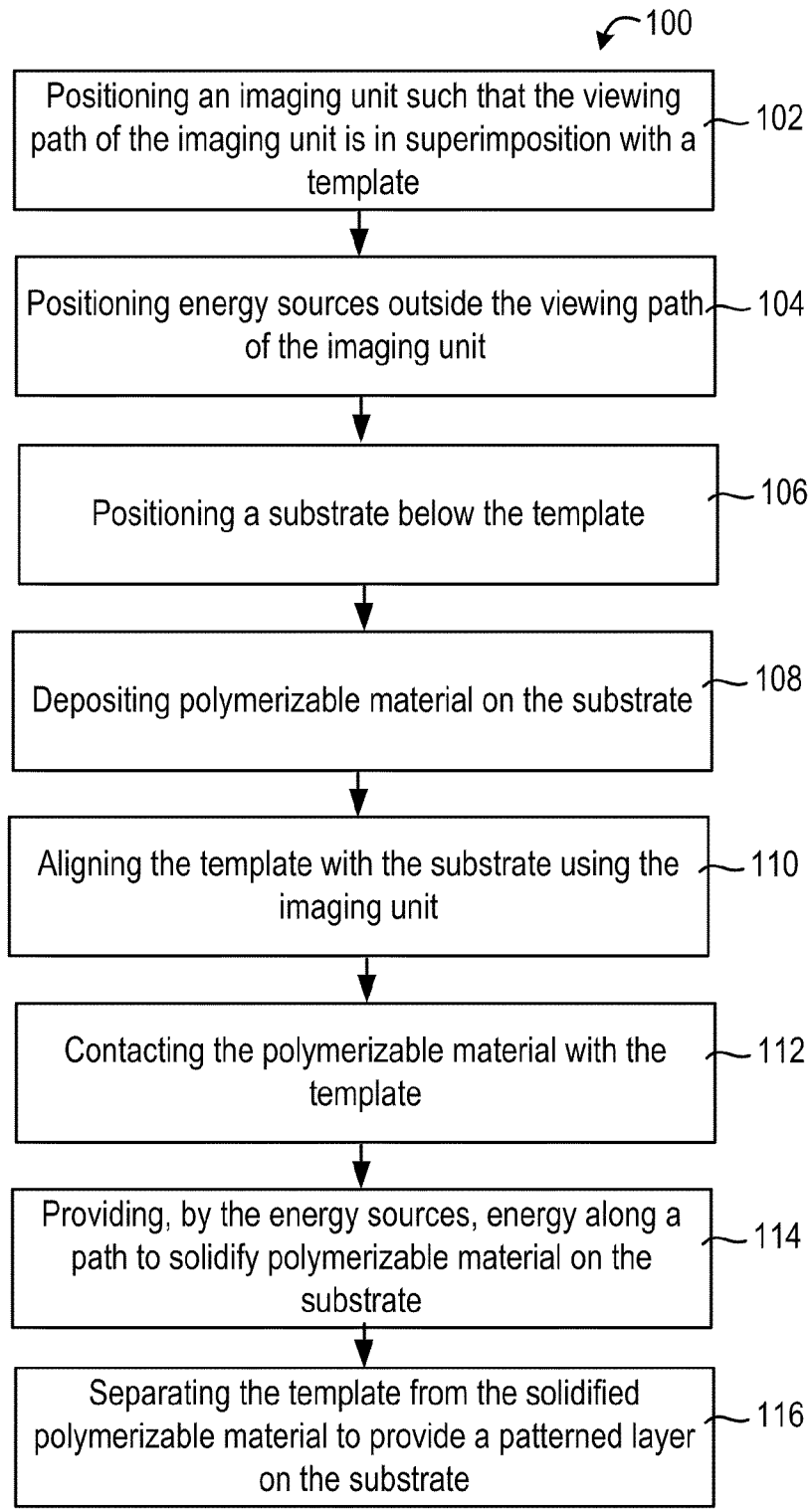
FIG. 8 illustrates a flow chart of an exemplary method of imprinting using an imprint lithography system.

FIG. 8 illustrates a flow chart 100 of an exemplary method of solidifying polymerizable material 34 on a substrate 12. In a step 102, imaging unit 58 may be positioned such that the viewing path 60 of imaging unit 58 is in superimposition with template 18. In a step 104, energy source(s) 38 having element(s) 64 may be positioned outside of the viewing path 60 of imaging unit 58. Each element 64 of energy source may be positioned at distance d from region r of substrate 12. Elements 64 may be adjusted to provide substantially uniform distribution of energy 40 to region r of substrate 12 during solidification of polymerizable material 34. In a step 106, substrate 12 may be positioned below the template 18. In a step 108, polymerizable material 34 may be deposited on substrate 12. In a step 110, template 18 may be aligned with substrate 12 using imaging unit 58. In a step 112, template 18 may contact polymerizable material 34 on substrate 12. In a step 114, energy source(s) 38 may provide energy 40 in path 42 to solidify polymerizable material 34 on substrate 12. In a step 116, template 18 may be separated from the solidified polymerizable material 34 to provide patterned layer 46 on substrate 12.

What is claimed is:
1. An imprint lithography system, comprising:
an imaging unit having a viewing range configured to monitor a template and a substrate, the imaging unit positioned in superimposition with the template and the substrate, the substrate having a surface having multiple regions with polymerizable material deposited thereon; and,
multiple energy sources, each having at least one energy element, positioned outside of the viewing range of the imaging unit, each energy source configured to provide energy along an energy path and wherein the elements of each energy source are inclined at angles so as to provide substantially uniform energy within a region of the substrate for solidifying the polymerizable material at each such region.

2. The system of claim 1, wherein each energy source has a single energy element.

3. The system of claim 1, wherein each energy source has multiple energy elements.

4. The system of claim 1, wherein at least one energy source has a single energy element and at least one energy source has multiple energy elements.

5. The system of claim 1, wherein at least one energy element is a UV LED.

6. The system of claim 1, wherein the energy sources are in a ring formation.

7. The system of claim 1, wherein the energy sources are in a cone formation.

8. The system of claim 1, wherein the energy sources are in a pyramid formation.

9. The system of claim 1, further comprising a supplementary energy source positioned outside of the viewing range of the imaging unit.

10. The system of claim 9, wherein the supplementary energy source is an arc lamp.

11. The system of claim 1, wherein the elements of each energy source are inclined at an angle and inclination of each angle provides substantially uniform energy to the polymerizable material on the substrate.

12. The system of claim 1, wherein each element of each energy source is positioned at a distance from a region of the substrate, and the position of each energy element provides substantially uniform energy to the polymerizable material on the substrate.

13. The system of claim 1, wherein each element is in optical communication with an optical line to provide energy to the polymerizable material.

14. The system of claim 13, wherein at least one energy element is positioned at a distance greater than 2 m from the polymerizable material on the substrate.

15. The system of claim 13, further comprising at least one reflective element positioned in optical communication with at two energy elements of at least one energy source, the reflective element focusing energy from the at least two energy elements to the polymerizable material on the substrate.

16. The system of claim 1, wherein at least one energy element of the energy source is a LED having a low unit power of approximately 3-20 mW/cm$^2$.

17. The system of claim 1, further comprising at least one optical element positioned adjacent to the energy source to direct the energy of at least one energy element to the substrate.

18. A method of imprinting, comprising, positioning an imaging unit such that a viewing path of the imaging unit is in superimposition with a nano-imprint lithography template;

positioning a plurality of energy sources between the imaging unit and the nano-imprint lithography template, the positioning of the energy sources being outside of the viewing path of the imaging unit, wherein each energy source is configured to provide energy along an energy path and wherein the elements of each energy source are inclined at angles so as to provide substantially uniform energy within a region of a substrate;

positioning a substrate below the template, the substrate having a surface having a plurality of regions;

depositing polymerizable material on the regions of the substrate;

aligning the template and the substrate;

contacting the polymerizable material on the substrate with the template;

providing, by the energy sources, energy along the energy paths solidifying polymerizable material on each of the regions of the substrate; and, separating the template from the solidified polymerizable material providing a patterned layer on the substrate.

* * * * *